United States Patent [19]

Iwai et al.

[11] Patent Number: 4,866,393

[45] Date of Patent: Sep. 12, 1989

[54] METHOD OF DIAGNOSING THE DETERIORATION OF A ZINC OXIDE TYPE LIGHTNING ARRESTER UTILIZING VECTOR SYNTHESIS

[75] Inventors: Hiromi Iwai; Masatoshi Nakajima; Hiroshi Asaga; Nobuyuki Takao; Satoru Shiga; Yoshihiro Tanabe, all of Kanagawa, Japan

[73] Assignee: Fuji Electric Co., Ltd., Kanagawa, Japan

[21] Appl. No.: 103,817

[22] Filed: Oct. 2, 1987

[30] Foreign Application Priority Data

Oct. 3, 1986 [JP] Japan .................................. 61-235524
Jul. 24, 1987 [JP] Japan .................................. 62-184751

[51] Int. Cl.⁴ .......................................... G01R 31/02
[52] U.S. Cl. ..................................... 324/549; 324/72
[58] Field of Search ................. 324/72, 549, 551, 552; 340/635, 647, 650; 361/126, 127, 130

[56] References Cited

U.S. PATENT DOCUMENTS 4,507,701  3/1905  Fujiwara et al. ..................... 324/72

Primary Examiner—Reinhard J. Eisenzopf
Assistant Examiner—Walter E. Snow
Attorney, Agent, or Firm—Finnegan, Henderson, Farabow, Garrett, & Dunner

[57] ABSTRACT

A method of diagnosing the deterioration of a zinc oxide type lighting arrester having one or more series-connected non-linear resistance elements including steps of elimination of the effects of capacitive currents from phase currents; obtaining a synthesized waveform using a window type transformer based on the resistance elements alone; and diagnosing the presence of a deteriorated non-linear resistance element by generating a first pulse voltage when the maximum crest value of the synthesized waveforms exceeds a predetermined value, generating a second pulse voltage representative of terminal voltage of the resistance element, and calculating the difference between the first and second pulse voltages.

5 Claims, 12 Drawing Sheets

METHOD OF DIAGNOSING THE DETERIORATION OF A ZINC OXIDE TYPE LIGHTNING ARRESTER UTILIZING VECTOR SYNTHESIS

BACKGROUND OF THE INVENTION

1. Field of the Invention

This invention relates to a method of diagnosing the presence of deterioration of a 3-phase lightning arrester assembly which includes one or more series-connected non-linear resistance elements comprised of zinc oxide, enclosed within a container and forming respective phase arresters of the 3-phase lightning arrester assembly. The method uses resistance currents in phase with terminal voltages of the arresters which have passed through the arresters.

2. Description of the Related Art

In a conventional lightning arrester assembly comprising one or more series-connected non-linear resistance elements comprised of zinc oxide and enclosed in a container, the currents which can flow through the elements under a normal voltage are very small, usually on the order of ten $\mu A$, depending upon the characteristics of the respective resistance elements. Currents having such magnitude do not raise the normal temperature of the resistance elements and, therefore, do not cause deterioration of the elements due to a raised temperature. A conventional lightning arrester assembly, which usually has no discharge gaps, can be placed in series with the corresponding non-linear resistance elements and can use currents of a small magnitude without being deteriorated.

However, the non-linear resistance elements may be deteriorated due to thermal cycles, based on the operational and atmospheric conditions under frequently-occurring abnormal voltages. And, if this deterioration advances, the elements will not be able to withstand the normal phase voltages in the power system and may break down, thereby hindering the system operation. Therefore, it is desirable to provide a method of continuously monitoring the resistance currents during the operation of the arrester assembly in order to determine the initial deterioration of the non-linear resistance elements.

FIG. 15 illustrates the voltage-current characteristics of a typical non-linear resistance element. In FIG. 15, the solid line 25 shows the characteristic of a normal resistance element and the alternate long and short dashed line 35 illustrates the characteristic of a deteriorated resistance element. The current represented by the I-axis shows a resistance current which does not contain any effects based on the electrostatic capacitance between both end faces of a disc-type non-linear resistance element. A phase voltage in the system is designated as Vn. The current flowing through a resistance element under such phase voltage varies depending upon the temperature of the element, and if the element is deteriorated, the current varies greatly even at the same temperature. For example, if the temperature of the element initially is $\theta_2$, when the current $I_{R1}$ flows through the element when the element is functioning normally, the current varies greatly until it becomes equal to $I_{R2}$. Therefore, by measuring the current flowing normally and comparing this measured current with the current flowing through the normal resistance element corresponding to the temperature of the resistance element when the measurement is performed, the presence of deterioration can be accurately determined. In FIG. 15, the temperature relationship $\theta_2 > \theta_1$ holds.

If the current flowing through an arrester is measured by a current sensor connected in series with the arrester, the sensed current contains a resistance current as well as a capacitive current because the voltage applied to the arrester includes an alternating current having a running frequency.

FIG. 16 shows a lightning arrester 2 connected across a power line and to ground. If the arrester 2 has insulative container enclosing the resistance elements, it is considered as containing the insulator and the resistance elements, but if the container is made of metal it is grounded and treated as containing the resistance elements alone.

FIG. 17 shows an electrical equivalent circuit of the arrester shown in FIG. 16. Each of the resistance elements are usually formed in a disc which has a relatively large electrostatic capacitance C between the end faces thereof, so that the current flowing through the arrester includes the vector sum of a resistance current $I_R$, raising the temperature of the element, and a capacitive current $I_c$ flowing through the capacitance. In order to determine the deterioration of a resistance element, it is necessary to extract only the resistance current $I_R$ from the vector sum. In FIG. 17, reference character L represents the inductance of the grounded conductor of the arrester. It should also be noted that when the container enclosing the arrester is made of insulative material, the capacitive current $I_c$ includes a capacitive effect due to the electrostatic capacitance of the insulator.

FIG. 18 illustrates a conventional method of measuring a resistance current and FIG. 19 illustrates the waveforms of the voltage and current measured using the method of FIG. 18. The arrester 2 connected to a bus or transmission line 1 is grounded via a current sensor 4 and the bus or transmission line is grounded via a voltage sensor 3. The outputs from the current and voltage sensors 4 and 3 are input, via amplifiers 6 and 7, to a computer 8 to compute the resistance current. The calculation of this resistance current is performed by differentiating the voltage V, measured by the voltage sensor 3; amplifying the differentiated waveforms so that the crest value of the waveform coincides with the crest value of $I_c$ of FIG. 17; and subtracting the amplified waveform from the overall current $I_s$ measured by the current sensor 4, as shown in FIG. 19. The resulting resistance current $I_R$ is compared with the normal resistance current at the temperature of the resistance element measured in parallel with this measurement to determine the presence of deterioration.

If the automatic monitoring of a 3-phase lightning arrester connected to a 3-phase transmission line is desired for use in diagnosing the deterioration of the 3-phase arrester using the above method, current sensors 41, 42 and 43 and voltage sensors 31, 32 and 33 for 3 phases are required, as shown in FIG. 20, even if the amplifiers 6 and 7 and the computer 8 used in FIG. 19 may be shared for this purpose. In addition, a change-over device 5, having many changeover contacts, is required to allow the sensed current and voltage values having the same phase to be input to respective amplifiers 6 and 7. The deterioration of the resistance elements advances at a maximum speed on the order of an hour, so that a satisfactory determination of deterioration can be performed by switching the respective phases sequentially.

As described above, the diagnosis of the deterioration of the resistance elements using the conventional method requires more current sensors and leads as the number of transmission lines increases (the voltage sensors may be shared). Furthermore, the changeover device is quite large and the use of this device complicates the diagnostic procedure. thus, a more simplified diagnostic method of desired.

SUMMARY OF THE INVENTION

It is therefore an object of this invention to provide a simple diagnostic method which can be used when the transmission lines, to which lightning arresters are connected, increase in number and when the number of current sensors and leads also increase.

Additional objects and advantages of the invention will be set forth in part in the description which follows, and in part will be obvious from the description, or may be learned by practice of the invention. The objects and advantages of the invention may be realized and attained by means of the instrumentalities and combinations particularly pointed out in the appended claims.

To achieve the above objects, and in accordance with the purpose of the invention, as embodied and broadly described herein, there is provided a method of diagnosing the presence of deterioration in one or more series-connected non-linear resistance elements comprised of zinc oxide and being enclosed within a container, the resistance elements forming respective phase arresters of a 3-phase lightning arrester assembly, the method comprising the steps of: (a) using resistance currents in phase with terminal voltages of the arresters which have passed through the arresters; (b) eliminating capacitive currents contained in the respective phase current; (c) obtaining a synthesized waveform of resistance currents alone by 3-phase vector synthesis of the currents having passed through the respective phase arresters; and (d) diagnosing the presence of a deteriorated one of the non-linear resistance elements in the 3-phase arrester assembly from the synthesized waveform.

The accompanying drawings, which are incorporated in and constitute a part of this specification, illustrate several embodiments of the invention and, together with the description, serve to explain the principles of the invention.

DESCRIPTION OF THE PREFERRED EMBODIMENT

Figure 1:
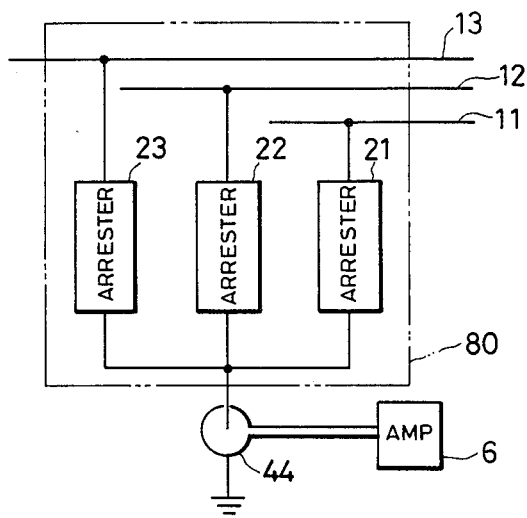
FIG. 1 is a circuit diagram of a system used in the method of diagnosing the deterioration of the arrester resistance elements in accordance with a first embodiment of the present invention.

Reference will now be made in detail to the present preferred embodiments of the invention, examples of which are illustrated in the accompanying drawings in which like reference characters refer to corresponding elements.

FIG. 1 illustrates one embodiment of the circuit structure which is capable of performing a deterioration diagnostic method according to this invention. Lightning arresters 21, 22 and 23 are connected to the corresponding phase buses or transmission lines 11, 12 and 13, respectively, and the ground sides of the arresters are grounded via a single current sensor which may be a zero phase current transformer in this embodiment. The ground side conductors of the arresters are extended in a bundle through the current transformer core and the secondary output of the current transformer has a desirable characteristic for diagnosing the deterioration of the arresters in which a small current of a particular phase, flowing through the primary side of the current transformer, is output to the secondary side thereof with high accuracy, and in which the iron core is saturated to prevent an excessive voltage from being output to the secondary side of the transformer when a large current flows. The broken line 80 denotes a common metal container containing resistance elements for three phases.

Figure 2:
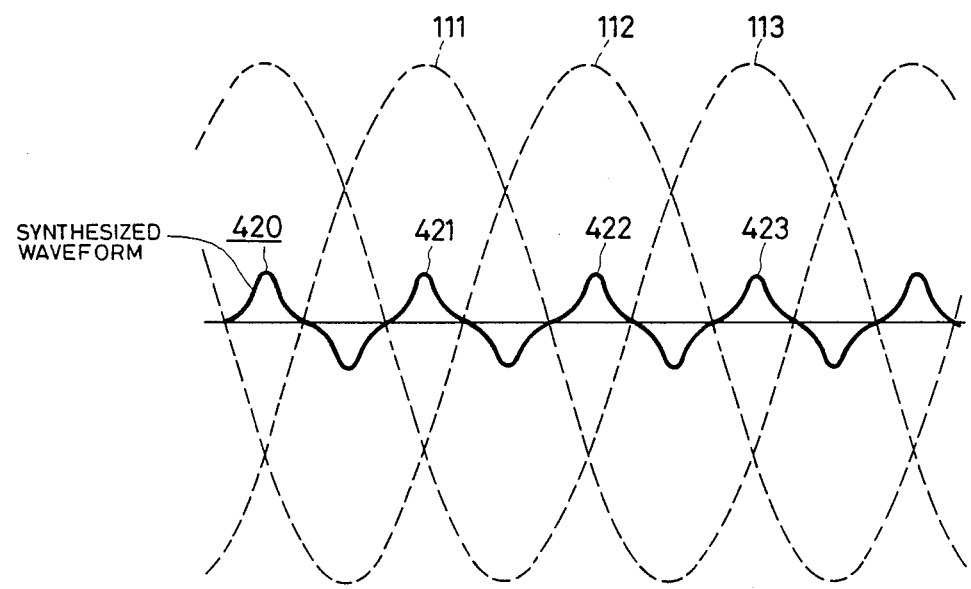
FIG. 2 is a waveform diagram illustrating the superposition of a synthesized current waveform for a 3-phase arrester obtained by the circuit structure of FIG. 1 on the waveforms of the respective phase-to-ground voltages on the bus or transmission lines which produce the synthesized current waveform.

FIG. 2 shows a superposition of current waveform obtained from the output of the amplifier 6 of the circuit of FIG. 1 and a 3-phase voltage waveform producing the current waveform. Reference numerals 111, 112 and 113 show the respective phase-to-ground voltages on the buses or transmission lines. Reference numerals 421, 422 and 423 show the peak values appearing at electrical angles of 60° in the synthesized current waveform 420 which is obtained by vector synthesis of the currents flowing through the respective phase arresters.

The synthesized current tends to rapidly increase as the voltage-current characteristic of the element (the voltage applied to the element) increases, while the synthesized current decreases rapidly as the applied voltage decreases. Therefore, the current waveform contains a large third harmonic wave as shown and the current peak values coincide in position with the crest values of the voltage waveforms. Therefore, if any one of the phase arrester elements of the 3-phase arrester assembly is deteriorated, the current peak value for that phase is greater than the current peak value for the remaining phases appearing at electrical angles of 60°, so that resistance element for that phase is diagnosed as being deteriorated. The deterioration diagnostic method of this invention measured no respective phase voltage waveforms, so that it cannot specify which phase deterioration occurs in. As described above, however, the structure of the circuit for diagnosis is simplified by omitting conventional voltage sensors and can comply with common maintenance practice in which a 3-phase arrester assembly accomodating its 3-phase arrester elements in a common metal container can be rapidly replaced in a bundle with a new one, even if deterioration occurs in any phase element of the assembly.

In the 3-phase arrester assembly in which 3-phase arresters are enclosed within a common container, the elements for the three phases are all replaced with new ones, even when only one phase of an element is deteriorated, in order to expedite replacement in a short time. In a 3-phase arrester assembly in which the phase elements are enclosed within separate insulators and installed outdoors, it is necessary to replace only the phase element which is deteriorated. This invention provides a very simple deterioration diagnostic method which can be used with any 3-phase arrester assembly. Also, in this invention, it is possible to inexpensively specify a deteriorated phase out of the three phases using the synthesized waveform of the resistance currents alone obtained by a 3-phase vector synthesis of the currents passing through the arresters, as will be described in detail below.

Figure 3:
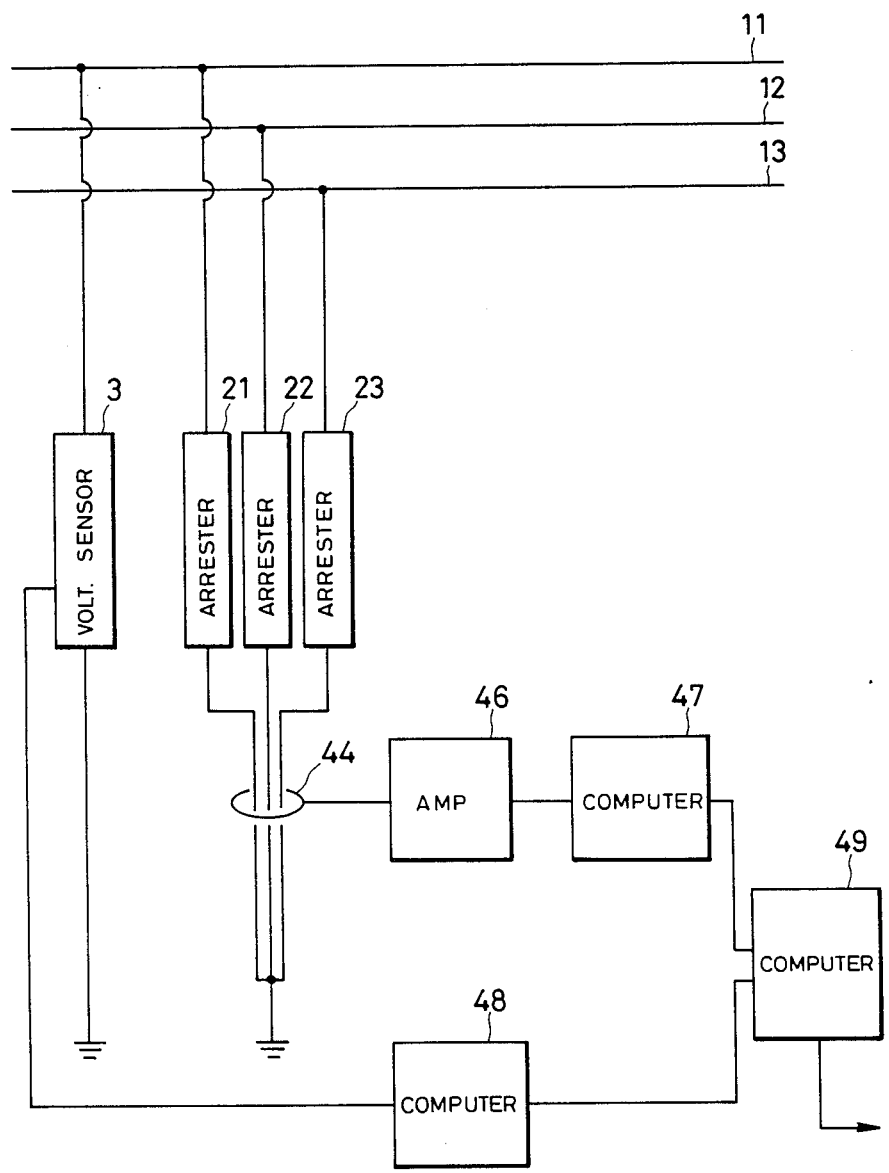
FIG. 3 is a circuit diagram of a system used in the method of diagnosing the deterioration of arrester elements in accordance with a second embodiment of the present invention.
Figure 4:
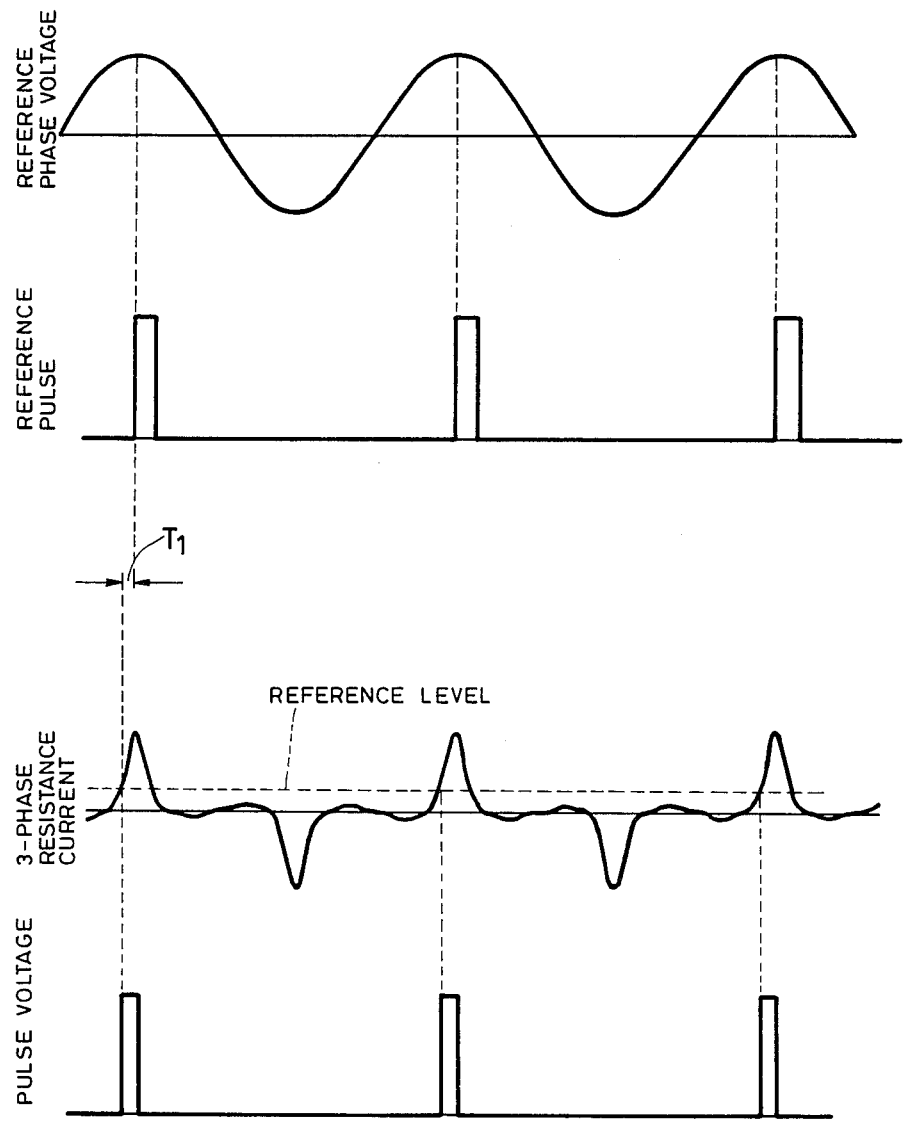
FIG. 4 is a waveform diagram illustrating the relationship in time between voltages and currents obtained by the circuit structure of FIG. 3 and pulse voltages obtained from these voltages and currents.

FIG. 3 illustrates a second embodiment of a circuit structure used for performing a deterioration diagnostic method of this invention. This embodiment illustrates an example of a circuit structure which is capable of specifying a deteriorated phase in order to replace only a deteriorated phase of an arrester element. For example, it uses a 3-phase arrester containing the respective separate phase elements in separate insulator tubes and which is installed outdoors. It should be noted that it is possible to specify a deteriorated phase element by simultaneously recording the respective phase-to-ground voltages on the buses or transmission lines, as shown in FIG. 2. A voltage sensor for this recording may be a single one, common to all the three-phase arresters; many voltage sensors are not required. Since a voltage sensor connected to a high voltage line is expensive, it is desirable to provide a method which uses the minimum number of voltage sensors.

Lightning arresters 21, 22 and 23 are connected to the corresponding phase buses or transmission lines 11, 12 and 13 and are commonly grounded, at their ground sides, via a single current sensor 44. A voltage sensor 3 is connected to any single one of the 3-phase buses or transmission lines, for example, line 11, as illustrated in FIG. 3. It should be noted that a zero-phase current transformer can also be used a current sensor 44 because it has a desirable characteristic for diagnosing the deterioration of the arresters.

The current sensed by current sensor 44 and amplified by the amplifier 46 is input to the computer 47. When the input current exceeds a predetermined value, corresponding to a reference level or a predetermined level high enough to prove the initial deterioration of an arrester element, the computer 47 produces a pulse voltage which is then input to a computer 49. The waveform of the bus or phase voltage measured by the voltage sensor 3 is input to a computer 48 which produces, at a peak position of the input voltage waveform, a pulse voltage which is then input to the computer 49. The computer 49 calculates the difference in time between the occurrence of the pulse voltage at the peak position of the voltage waveform and the occurrence of the pulse voltage when the magnitude of the synthesized current exceeds the reference level to thereby specify the deteriorated phase as shown in FIG. 5.

Figure 5:
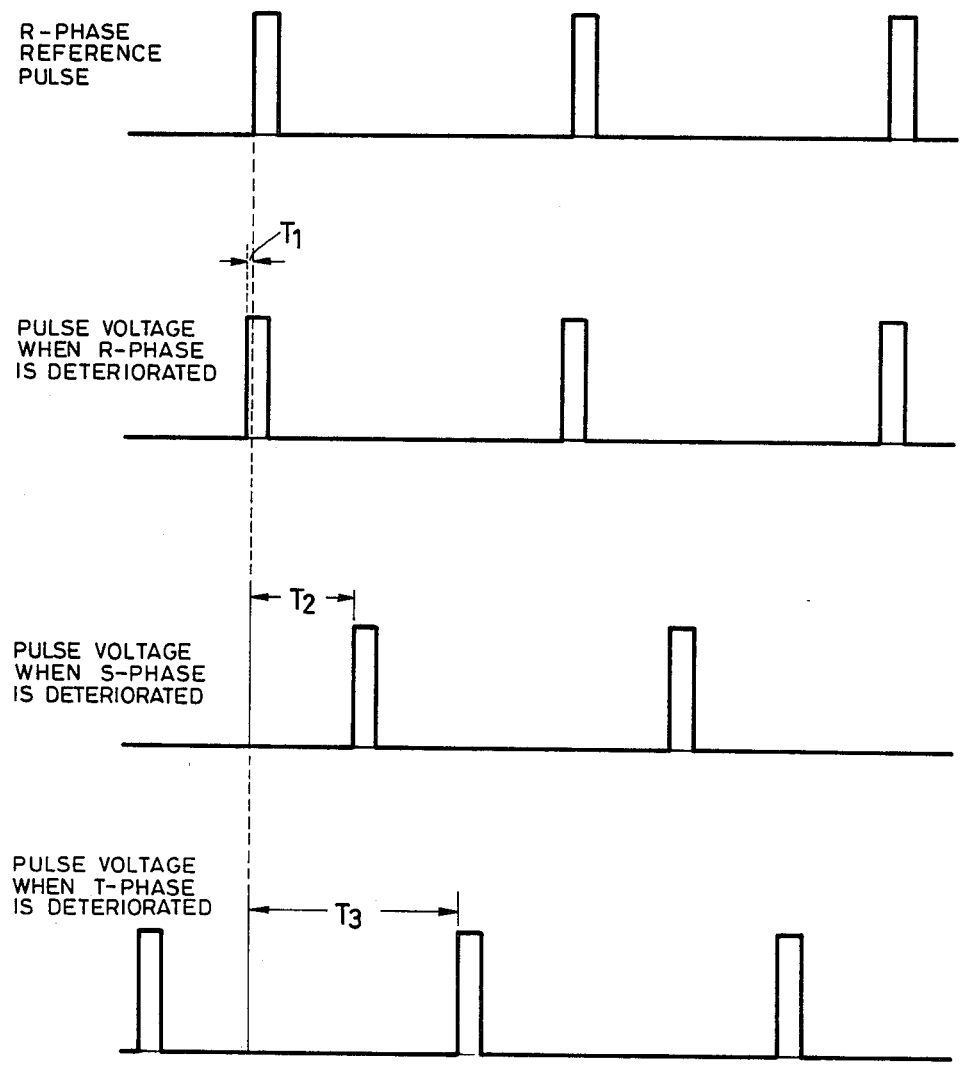
FIG. 5 is a pulse voltage waveform diagram for specifying a deteriorated phase.

As shown in FIG. 5, and assuming that the bus or transmission line to which the voltage sensor is connected has a R phase, the pulse voltage produced at the position of the R-phase-to-ground voltage peak is used a reference pulse constituting the starting point for time measurement. The time from the position of the reference pulse to a time when the magnitude of the synthesized current exceeds the reference pulse level is measured. It can be specified that the deteriorated phase is the same as the reference phase if the measured time is substantially equal to zero; that the deteriorated phase is the next phase in accordance with the order of the phases if the time corresponds to an electrical angle of 120° as T2, and the deteriorated phase is the second phase after the reference phase if the time corresponds to an electrical angle of 240° as T3.

Figure 6:
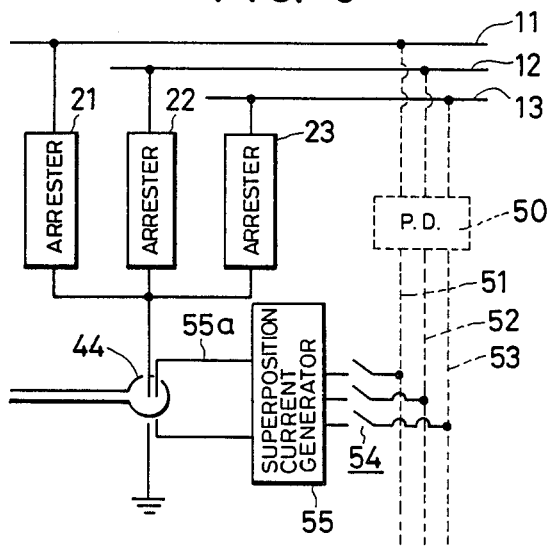
FIG. 6 is a circuit diagram of a system used in the method of diagnosing the deterioration of arrester elements in accordance with a third embodiment of the present invention.

FIG. 6 illustrates a circuit for diagnosing deterioration according to a third embodiment of this invention. This embodiment uses another circuit for specifying a deteriorated phase. A potential transformer PT or a potential device PD 50 is disposed within an electrical station in which a lightning arrester assembly is installed, the secondary side of which connected via a switch 54 to a superposition current generator 55, to be described in more detail hereinafter. An output conductor 55a is connected to the output side of the generator 55 and passes through the core of zero-phase current transformer 44 which includes a current sensor.

The superposition current generator 55 has a structure in which a current waveform is obtained from a non-linear resistance element of the arresters, deteriorated due to being impressed with a to-ground voltage on the bus or transmission line until the current passing through the arrester under the to-ground voltage becomes a set current level high enough to prove the initial deterioration of the arrester element. The current waveform is output with a polarity opposite to the current passing through the arresters in synchronism with the secondary side voltage of PT or PD 50 introduced via the switch 54. The generator 55 determines the arrester having a deteriorated phase element depending upon how the waveform of the 3-phase vector synthesized current obtained on the secondary side of the zero-phase current transformer 44 in the open circuit state of the switch 54 changes when the switch 54 is is alternately opened and closed for the respective phases.

Figure 7:
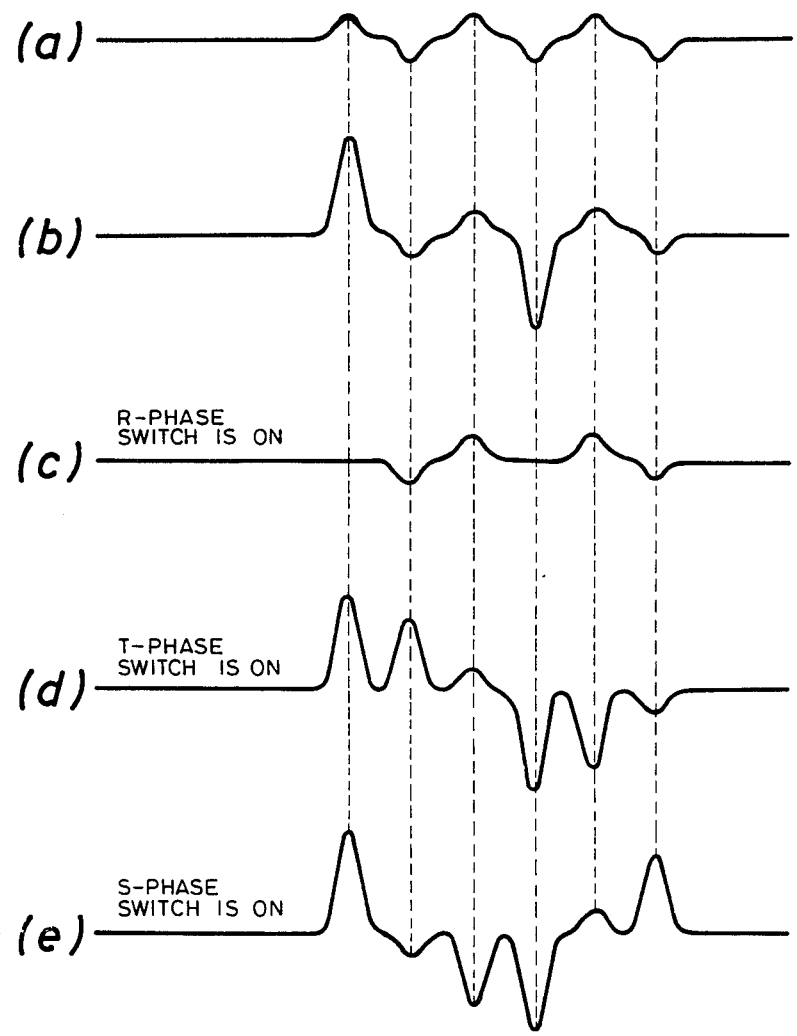
FIG. 7 is a waveform diagram illustrating changes in the 3-phase vector synthesized current waveform in the course of the diagnosis for specifying one deteriorated phase element of the arrester.

As shown in FIG. 7, when a synthesized waveform (a) of resistance currents 11, obtained when all the 3-phase arrester elements are operating normally in the open state of the switch 54, changes as shown by the waveform (b), and when its maximum crest value exceeds a predetermined deterioration level, an alarm circuit (not shown in FIG. 6) produces an alarm, reporting that at least one phase of the arresters has deteriorated. Thus, when the switch 54 is closed manually or automatically, the respective phase voltages obtained on the secondary side of PT or PD 50 are taken into the generator 55 so as to be opposite in polarity to the currents passing through the arresters and a current having the same waveform as a current having the deteriorated level in the waveform (b) is output with an opposite polarity. Therefore, if a waveform from which a current waveform having a deteriorated level, such as shown (c) on the secondary side of the zero-phase current transformer 44, is obtained when the switch 54 is closed for the R-phase, it will be seen that deterioration has occurred in at least the R-phase arrester element. If a waveform such as (d) is obtained when the switch 54 is opened for the R phase and closed for the T-phase, the T-phase arrester element has not been deteriorated and the deteriorated phase arrester has yet to be determined. Similarly, when the switch 54 is closed for the S-phase alone, a current waveform having a deteriorated level is not eliminated as shown by the waveform (e). Using the above switch operations, it can be specified that the deterioration phase is the R-phase.

Figure 8:
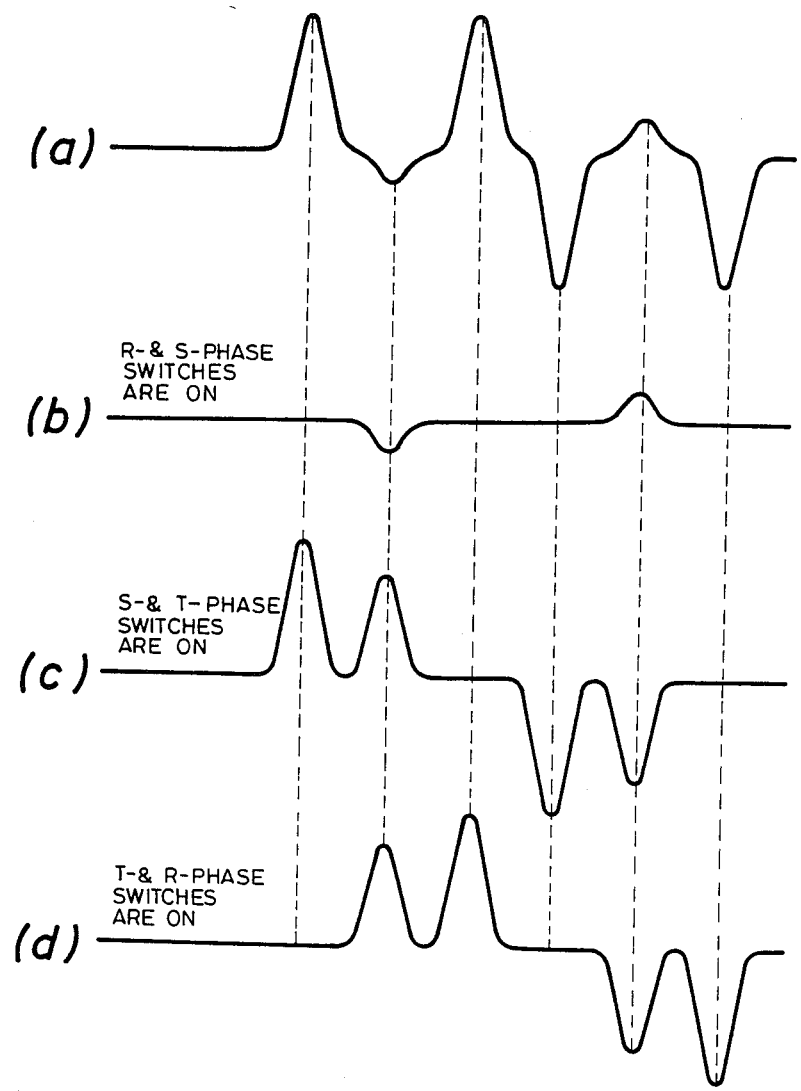
FIG. 8 is a waveform diagram illustrating a 3-phase vector synthesized current waveform used to specify two deteriorated phase arrester elements which change during the course of diagnosis.

FIG. 8 illustrates a change in the synthesized current waveform in the course of diagnosis when deterioration occurs in two different phase arrester elements. Assuming, for example, that when the switch is closed for R-phase and S-phase in response to the operation of an alarm (not shown), the synthesized current waveform changes as shown by waveform (b) in FIG. 8 and the two deteriorated phase current waveforms have been eliminated. Next, assuming that when the switch is closed for the S-phase and T-phase, the current having the deteriorated level for one phase does not change, as shown in FIG. 8 and waveform (c). the current waveform representing the difference between a current having the deteriorated level and the normal resistance in the adjacent phase and the current waveform for the remaining phase had been eliminated. Assume also that when the switch is closed for the T-phase and R-phase, the current waveform for one phase is eliminated, the current waveform representing the difference between the current having the deteriorated level and the normal resistance current appears in the adjacent phase, and the current waveform having the deteriorated level for the remaining one phase does not change. While the manner of operating the switch is arbitrary, the deteriorated phases can be specified as R- and S-phases from a change in the waveform of the synthesized current obtained by the switch operation for two phases at a time.

Figure 9:
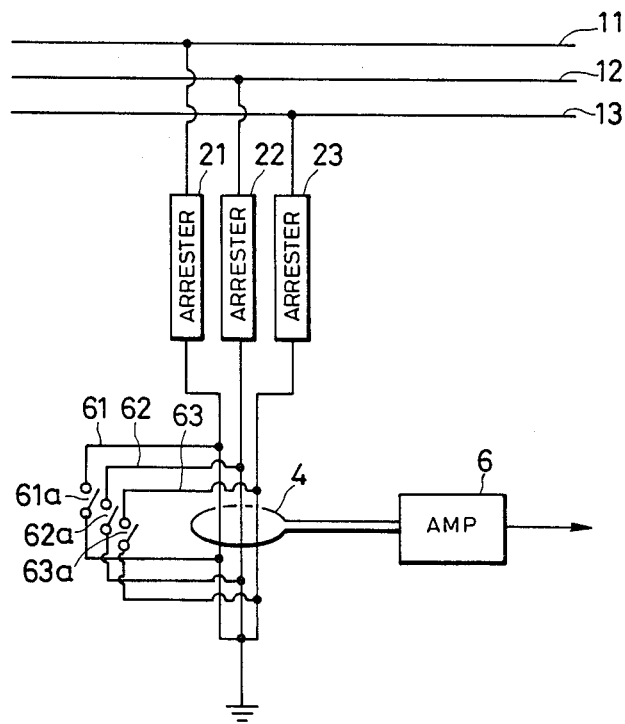
FIG. 9 is a circuit diagram of a system used in the method of diagnosing the deterioration of arrester elements in accordance with a fourth embodiment of the present invention.

FIG. 9 illustrates a circuit for diagnosis of deterioration according a fourth embodiment of the invention. Bypass circuits 61, 62 and 63, bridging the zero-phase current transformer 4, are connected via switches 61a, 62a and 63a to respective grounding conductors of the arresters passing through the annular core of a current sensor. Here, a zero-phase current transformer 4 is used, which provides a three-phase vector synthesized waveform of currents passing through the respective arresters 21, 22 and 23 corresponding to the respective phases of the three-phase arrester assembly. When any one of the switches 61a, 62a and 63a is closed, a part of the current passing through the arrester assembly does note pass through the zero-phase current phase transformer, but is shunted to the corresponding bypass circuit. The shunting ration is considered to be about 50% when a conductor, used as the conductor of the bypass circuit, has the same cross-sectional area as the primary side conductor of the transformer 1 because the current transformation ration if about 1000:1 and because the impedance of the transformer 4, viewed from its primary side, is substantially negligible.

Figure 10:
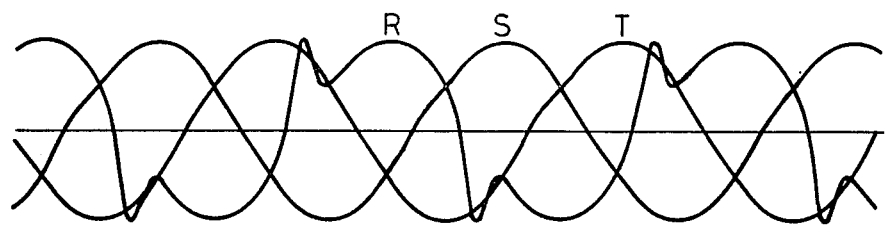
FIG. 10 is a diagram illustrating the waveforms of currents passing through the respective phase arresters in which one phase arrester element is deteriorated.
Figure 11:
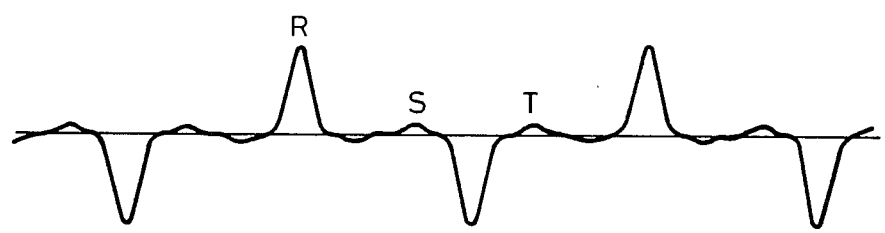
FIG. 11 is a diagram of a 3-phase vector synthesized current waveform of the respective currents shown in FIG. 10 passing through the arresters.

FIG. 10 illustrates an example of the waveforms of currents passing through the respective phase arresters when all of the switches 61a, 62a and 63a are opened. FIG. 11 illustrates the three-phase vector synthesized waveform of the currents passing through the respective phase arresters shown in FIG. 10.

Figure 12:
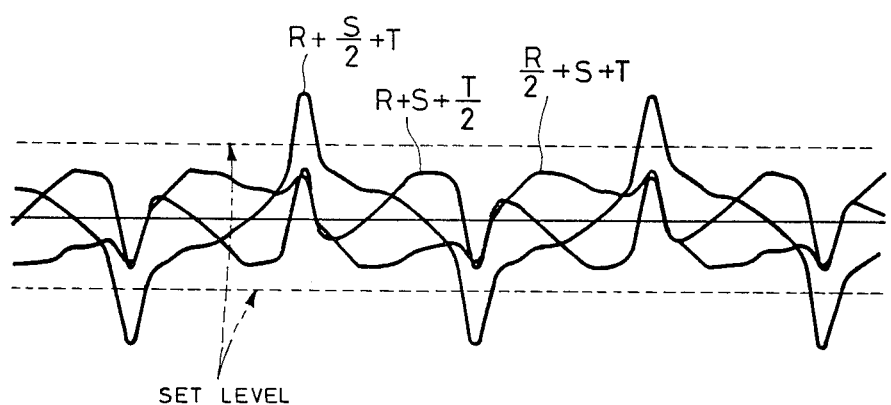
FIG. 12 is a waveform diagram illustrating a 3-phase vector synthesized current excluding part of the current passing through any one of the phase arresters.

FIG. 12 illustrates a current waveform obtained on the secondary side of the current transformer when the switches 61a, 62a and 63a of the respective bypass circuit are alternately closed in the case for which the R-phase arrester element is deteriorated, as will be seen from the example of the waveforms of FIG. 11. In FIG. 12, for example, reference character R/2+S+T illustrates a current waveform obtained on the secondary side of the current transformer when the switch 61a is closed and when the arrester 21 is of the R-phase type. Similarly, reference characters R+S/2+T and R+S+T/2 illustrate current waveforms obtained when the switches 62a and 63a, respectively, are closed.

As seen from FIG. 12, the maximum synthesized current crest value decreases below a predetermined deterioration level to prove the initial deterioration of an element when the switch 61a is closed. The crest value does not change when the switch 62a is closed and decreases again below the predetermined level when the switch 63a is closed.

Figure 13:
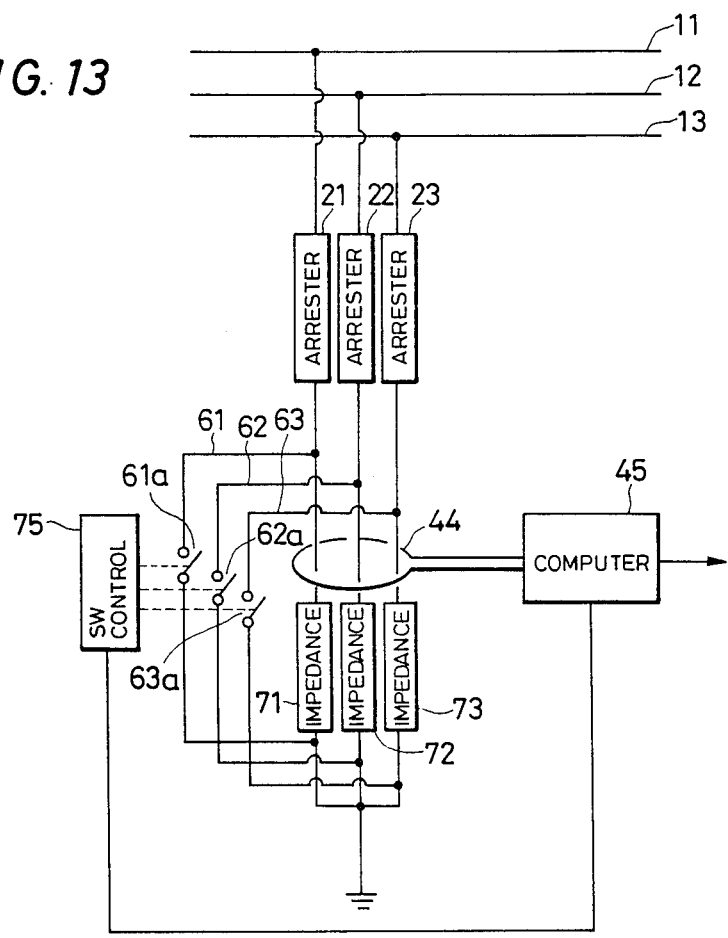
FIG. 13 is a circuit diagram of a system used in the method of diagnosing the deterioration of arrester elements in accordance with a modification of the fourth embodiment shown in FIG. 9.

FIG. 13 illustrates a modification of the embodiment of FIG. 9. This embodiment has a circuit structure such the the percentage of the currents shunted to the bypass circuit 61, 62 and 63 when the switches 61a, 62a and 63a are closed is substantially equal to 100% while the percentage of the shunting currents in the fourth embodiment is about 50%. Through impedance 71, 72 and 73 are interposed in series with the respective grounding conductors of the phase arresters, and switches 61a, 62a and 63a are interposed in series with the bypass circuits 61, 62 and 63 extending over the impedances 71, 72 and 73 zero-phase current transformer 44. The impedances 71, 72 and 73 are equal to a value low enough so that when the arresters operate in response to a lightning stroke, the to-ground voltage appearing on the bus or transmission lines do not rise to a value high enough to jeopardize the insulation of the bus or transmission lines.

Figure 14:
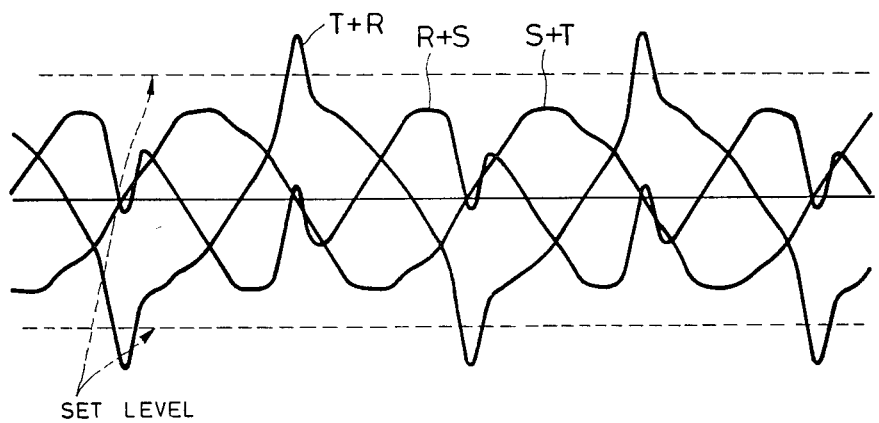
FIG. 14 is a waveform diagram of a 2-phase vector synthesized current waveform excluding all of the current passing through any one of the phase arresters.
Figure 15:
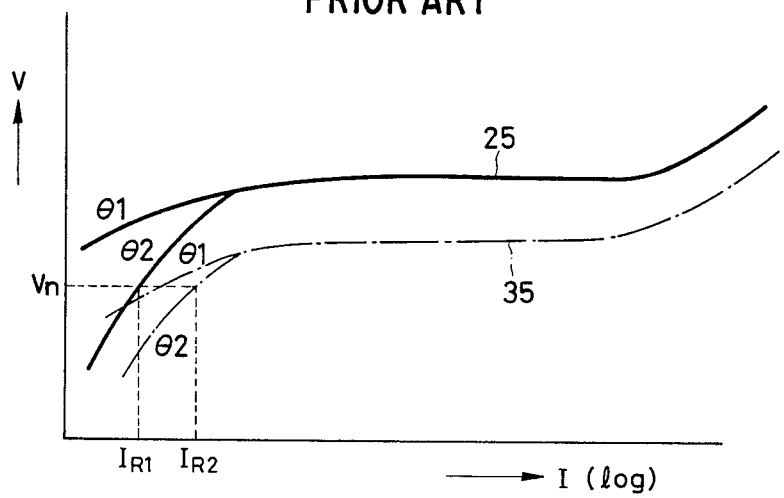
FIG. 15 is a diagram illustrating the difference between the normal and deteriorated characteristics of the arrester elements in a conventional lightning arrester.
Figure 16:
FIG. 16 is a single-line diagram showing the connection of an arrester and its external circuit in a conventional lightning arrester.
Figure 17:
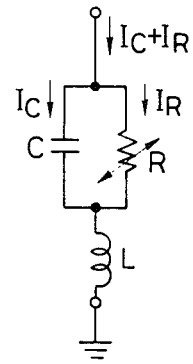
FIG. 17 is a equivalent circuit diagram of an arrester showing the current component of the current passing through the arrester in a conventional lightning arrester.
Figure 18:
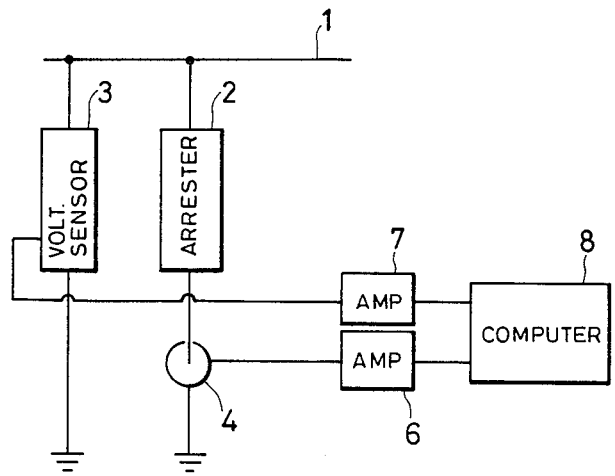
FIG. 18 illustrates an example of a conventional measuring circuit for one phase of an arrester in order to extract only a resistance current of the current passing through the arrester.
Figure 19:
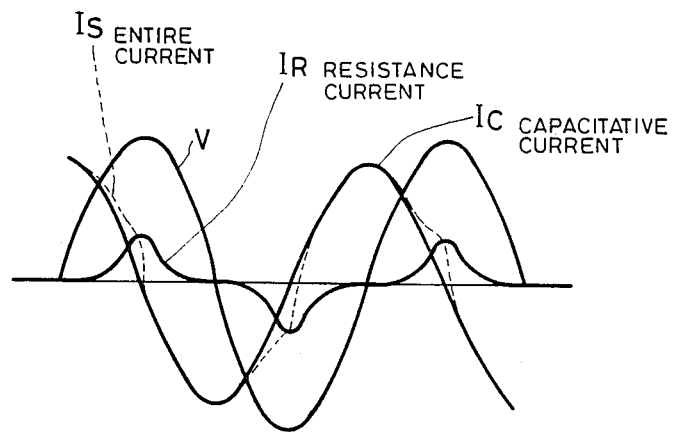
FIG. 19 is a current waveform diagram illustrating the waveform of the entire current passing through an arrester and of a current component of the entire current.
Figure 20:
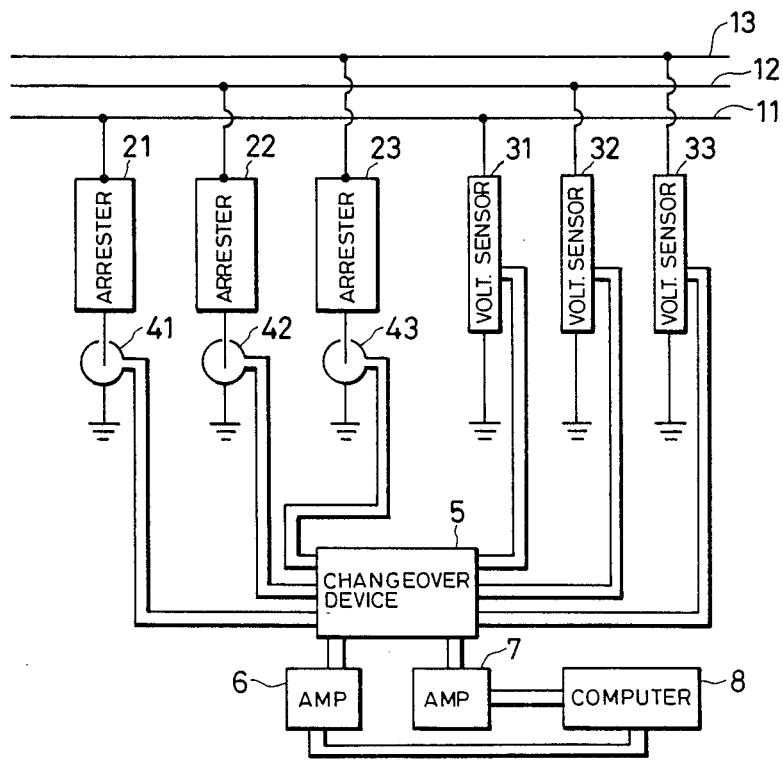
FIG. 20 illustrates one example of a conventional measuring circuit for a 3-phase arrester assembly used to extract only the resistance currents of the currents passing through the respective arresters.

In such a circuit structure, it is assumed that resistance element deterioration occurs in the R-phase arrester 21, and that the maximum crest value of the synthesized current waveform obtained on the secondary side of the zero-phase current transformer 44 exceeds the predetermined set value. The computer 45 then detects this crest value to deliver a control signal to a switch control device 75 to alternately open and close the switches 61a, 62a and 63a at appropriate time intervals. FIG. 14 illustrates changes in the synthesized current waveform at this time.

In FIG. 14, for example, reference characters S+T illustrates a current waveform obtained on the secondary side of the current waveformer when the currents on the primary side of the current transformer 1 are the only ones passing through the S- and T-phase arresters, namely, when all the current passing through the R-phase arrester is shunted to the bypass circuit 61 by closing the switch 61a. Similarly, reference character T+R and R+S illustrate the waveforms obtained when the switches 62a and 63a, respectively, are closed.

As seen in FIG. 14, the maximum synthesized current crest value is reduced below a predetermined deterioration level when the switches 61a and 63a are closed and is not changed when the switch 62a is closed.

The relationship between switch operation and change in the maximum synthesized current crest value from FIGS. 12 and 14 is shown in the following chart:

| Operated Switches | Maximum Synthesized Crest Value |
| --- | --- |
| 61a | Reduced |
| 62a | Unchanged |
| 63a | Reduced |

The maximum synthesized crest value remains unchanged only at times when a switch of a phase next of the phase for the element which is deteriorated is closed. Therefore, when the switches are alternately closed and the maximum synthesized current crest value is not changed by operating a switch for a phase, the arrester for a phase directly preceding the phase to which the closed switch belongs can be specified as being deteriorated.

As described above, this invention provides a method of diagnosing the presence of deterioration of one or more series-connected non-linear resistance elements comprised of zinc oxide, enclosed within a container, and forming respective phase arresters of a 3-phase lightning arrester assembly. The method comprises the steps of: (a) using resistance currents in phase with terminal voltage of the arresters which pass through the arresters; (b) eliminating capacitive current contained in the respective phase currents; (c) obtaining a synthesized waveform of resistance currents alone by 3-phase vector synthesis of the currents having passed through the respective phase arresters; and (d) diagnosing the presence of a deteriorated one of the non-linear resistance elements in the 3-phase arrester assembly from the synthesized waveform.

In the present invention, even if there are many arresters to be diagnosed with respect to deterioration, the number of current sensors and leads required for diagnosis is greatly reduced as compared to the prior diagnostic systems. The 3-phase vector synthesized current waveform obtained by the inventive method is inexpensive, has a simple construction, and may be applicable to 3-phase arresters.

It will be apparent to those skilled in the art that various modifications and variations can be made in the method of diagnosing deterioration of the present invention without departing from the scope or spirit of the invention. Thus, it is intended that the present invention cover the modifications and variations of this invention provided they come within the scope of the appended claims and their equivalents.

What is claimed is:

1. A method of diagnosing deterioration in one or more series-connected non-linear resistor elements comprised of zinc oxide and being enclosed within a container, said resistance elements forming respective phase arresters of a 3-phase lightning arrester assembly, said method comprising the steps of:
   (a) using phase currents which have passed through said resistance elements and are in phase with terminal voltages of arresters which have passed through the respective phase arresters;
   (b) eliminating capacitive currents contained in the respective phase currents to thereby obtain a synthesized waveform of all of the phase currents by 3-phase vector synthesis of the currents having passed through the respective phase arresters; and
   (c) diagnosing the presence of a deteriorated one of the non-linear resistance elements in the 3-phase arrester assembly from the synthesized waveform.

2. The method of claim 1, wherein said step of obtaining a synthesized waveform by the 3-phase vector synthesis is performed by using a window type current transformer, said transformer connected to the ground side conductors of said arresters, located on the primary side of said transformer, and includes an annular iron core through which said conductors pass in a bundle.

3. The method of claim 1, further including the steps of:
   sequentially superposing, on the synthesized waveform, respective phase current waveforms having the same crest value as a predetermined value and being obtained by predetermined combinations of said non-linear resistance elements, said superposed phase current waveforms having been deteriorated in advance, until the maximum crest value of the synthesized wave form exceeds a predetermined value determined on the basis of the respective phase arrester terminal voltages; and
   substantially eliminating that portion of the synthesized waveform exceeding the predetermined value to specify a deteriorated one of the non-linear resistance elements.

4. The method of claim 1, further including the steps of:
   sequentially eliminating a predetermined portion of the currents passing through the respective phase arresters when the maximum crest value of the synthesized waveform exceeds a predetermined value in order to perform a vector synthesis of 3- or 2-phase currents to obtain synthesized waveforms; and mutually comparing the 3-phase and 2-phase synthesized waveforms to specify a deteriorated one of the non-linear resistance elements.

5. A method of diagnosing deterioration in one or more series-connected non-linear resistor elements comprised of zinc oxide and being enclosed within a container, said resistance elements forming respective phase arresters of a 3-phase lightning arrester assembly, said method comprising the steps of:

(a) using phase currents which have passed through said resistance elements and are in phase with terminal voltages of arresters which have been passed through the respective phase arresters;

(b) eliminating capacitive currents contained in the respective phase current to thereby obtain a synthesized waveform of all of the phase currents by a 3-phrase vector synthesis of the currents having passed through the respective phase arreasters;

(c) generating a first pulse voltage when the maximum crest value of the synthesized waveform exceeds a predetermined value;

(d) generating a second pulse voltage representative of a terminal voltage of any of the arresters at a predetermined position on the synthesized waveform; and (e) diagnosing the presence of a deteriorated one of the non-linear resistance elements in the 3-phase arrester assembly from the difference in generation time between said first and second pulse voltages.

* * * * *